United States Patent
Schipfer et al.

(10) Patent No.: US 9,885,759 B2
(45) Date of Patent: Feb. 6, 2018

(54) TEST ARRANGEMENT OF AN ENERGY STORAGE DEVICE

(71) Applicant: AVL LIST GMBH, Graz (AT)

(72) Inventors: Gottfried Schipfer, Wettmannstätten (AT); Günter Prochart, Graz (AT)

(73) Assignee: AVL List GmbH, Graz (AT)

( * ) Notice: Subject to any disclaimer, the term of this patent is extended or adjusted under 35 U.S.C. 154(b) by 258 days.

(21) Appl. No.: 14/442,915

(22) PCT Filed: Nov. 11, 2013

(86) PCT No.: PCT/EP2013/073504
§ 371 (c)(1),
(2) Date: May 14, 2015

(87) PCT Pub. No.: WO2014/076033
PCT Pub. Date: May 22, 2014

(65) Prior Publication Data
US 2015/0293179 A1 Oct. 15, 2015

(30) Foreign Application Priority Data

Nov. 14, 2012 (AT) ................ A50513/2012

(51) Int. Cl.
*G01N 27/416* (2006.01)
*G01R 31/36* (2006.01)
(Continued)

(52) U.S. Cl.
CPC ..... *G01R 31/3658* (2013.01); *G01R 31/3696* (2013.01); *H01M 10/4285* (2013.01);
(Continued)

(58) Field of Classification Search
CPC .................................. G01R 31/3658
(Continued)

(56) References Cited

U.S. PATENT DOCUMENTS

| 5,751,150 | A | 5/1998 | Rippel et al. |
| 6,344,985 | B1 * | 2/2002 | Akerson ............. H02M 3/1582 363/65 |
| 8,354,825 | B2 | 1/2013 | Lee et al. |

FOREIGN PATENT DOCUMENTS

| AT | 508279 | 12/2010 |
| CN | 200950162 | 9/2007 |

(Continued)

OTHER PUBLICATIONS

English Abstract of JPH05276673.
(Continued)

*Primary Examiner* — Edward Tso
*Assistant Examiner* — Ahmed Omar
(74) *Attorney, Agent, or Firm* — Dykema Gossett PLLC (57) ABSTRACT

For an efficient, economical and at the same time flexibly usable or configurable test arrangement for energy storage devices including a plurality of energy storage modules, each including a plurality of energy storage units, an AC/DC converter (2) is connected on the output side to at least one bidirectional isolated module DC/DC converter ($5_1 \ldots 5_n$), wherein the output of the bidirectional isolated module DC/DC converter ($5_1 \ldots 5_n$) is connected to a plurality of parallel-connected cell DC/DC converters ($6_{11} \ldots 6_{nm}$) and the outputs of the cell DC/DC converters ($6_{11} \ldots 6_{nm}$) are brought out as outputs ($A_{1+}, A_{1-} \ldots A_{x+}, A_{x-}$) of the test arrangement (1).

15 Claims, 6 Drawing Sheets

(51) Int. Cl.
*H02J 7/00* (2006.01)
*H01M 10/42* (2006.01)
*H02M 3/04* (2006.01)
*H02M 7/04* (2006.01)

(52) U.S. Cl.
CPC ............. *H02J 7/0019* (2013.01); *H02M 3/04* (2013.01); *H02M 7/04* (2013.01)

(58) Field of Classification Search
USPC ........................................................ 324/426
See application file for complete search history.

(56) References Cited

FOREIGN PATENT DOCUMENTS

| CN | 101930058 | 12/2010 |
|---|---|---|
| CN | 102043131 | 5/2011 |
| CN | 102680898 | 9/2012 |
| CN | 202471920 | 10/2012 |
| CN | 202494763 | 10/2012 |
| EP | 2424069 | 2/2012 |
| JP | H05276673 | 10/1993 |
| JP | 2012143104 | 7/2012 |
| JP | 2012154793 | 8/2012 |
| JP | 2013160652 | 8/2013 |

OTHER PUBLICATIONS

English Abstract of JP2012143104.
English Abstract of JP2012154793.
English Abstract of JP2013160652.
English Abstract of CN102680898.
Translation of Abstract of CN102680898.
English Abstract of CN202494763.
English Abstract of CN101930058.
English Abstract of CN102043131.
English Abstract of CN202471920.
English Abstract of CN200950162.
English Abstract of EP 2424069.

\* cited by examiner

TEST ARRANGEMENT OF AN ENERGY STORAGE DEVICE

BACKGROUND OF THE INVENTION

Field of the Invention

The present invention relates to a test arrangement for an energy storage device having at least one energy storage module with a plurality of energy storage units, having an AC/DC converter which is connected on the input side to a power supply, and the use of such a test arrangement in a test and forming system.

The Prior Art

Current cell testers mainly work with inefficient linear charging regulators and convert all the charging energy into heat. This results in high costs for powerful cooling systems and high energy costs in the production and testing of batteries, e.g. for forming, quality checking, endurance tests, emulation, etc.

Occasionally, switching converters which are capable of feeding back energy are also used for cell testers; these are complex, expensive and have a poor efficiency as they have to provide a very high voltage ratio, e.g. step up from 3V to 400V. A switching converter for testing batteries is shown, for example, in WO 97/07385 A2, in which a number of bidirectional DC/DC converters are connected to an AC/DC converter.

It is an object of the present invention to specify an efficient, cost-effective and at the same time flexibly usable or configurable test arrangement.

SUMMARY OF THE INVENTION

According to the invention, this object is achieved in that the AC/DC converter is connected on the output side to at least one bidirectional isolated module DC/DC converter, wherein the output of the bidirectional isolated module DC/DC converter is connected to a plurality of parallel-connected cell DC/DC converters and the outputs of the cell DC/DC converters are brought out as outputs of the test arrangement. This hierarchical structure of the test arrangement by means of isolated DC/DC converters enables the test arrangement to be configured extremely flexibly; in particular, widely differing expansion stages are possible therewith. Equipment ranging from individual energy storage units to individual energy storage modules and complete energy storage devices can be tested and formed therewith without having to change the internal structure of the test arrangement. In doing so, the configuration can be changed very easily by means of controllable switches.

Basically, as is known, the efficiency of a converter improves with higher power level and with higher voltage level. In the present hierarchical structure of the test arrangement, the AC/DC converter has an efficiency of ~92%, the module DC/DC converters an efficiency of ~85%, and the cell DC/DC converters an efficiency of ~75%. Whenever possible, an attempt is therefore made to provide the energy for testing and emulation by the highest converter stage (AC/DC converter), which is possible thanks to the present structure. For many test cases, in particular when used as a test and emulation system for batteries, all energy storage units (e.g. the battery cells) are tested with the same setpoint over a long time. For example, in a charging cycle, all energy storage units can be supplied by the highest converter stage (AC/DC converter) for almost the whole CC (constant current) phase. The module or cell DC/DC converters only have to come into play when transferring to the CV (constant voltage) phase. This results in an efficiency advantage of ~92−75%=17% for usually more than 50% of the test period. The test arrangement according to the invention therefore also allows work to be carried out with the best possible efficiency.

For testing or forming, an energy storage unit of the energy storage module is simply connected to an output of a cell DC/DC converter. This enables the energy storage unit to be subjected to a specifiable charging current at the level of the cell DC/DC converter.

When the outputs of a module DC/DC converter are connected to the series-connected outputs of the associated cell DC/DC converters which are connected in series, discharging can take place even when using unidirectional cell DC/DC converters. With this, all energy storage units can be discharged by deactivating all cell DC/DC converters. However, individual energy storage units can also be subjected to any load current by superimposing a current of the cell DC/DC converter on the current of the associated module DC/DC converter.

Larger energy storage devices can be tested and formed when a plurality of module DC/DC converters are connected in parallel to the output of the AC/DC converter and each module DC/DC converter is connected to a plurality of parallel-connected cell DC/DC converters. This enables any expansion stages and configurations of an energy storage device to be tested and formed, which increases the flexibility of the test arrangement.

If the outputs of the module DC/DC converters can be connected in series by means of switches, energy storage devices which consist of a plurality of interconnected energy storage modules can also be tested or formed as a whole with high efficiency.

By bringing out the outputs of the module DC/DC converters via a switch, the test arrangement can also be connected at module level, e.g. as an input for a battery management system or for testing or forming individual energy storage modules as a whole.

If the output of the AC/DC converter is brought out via a switch as output of the test arrangement, the test arrangement can also be connected at energy storage device level, e.g. as an input for a battery management system or for testing or forming individual energy storage devices as a whole.

The flexibility of the test arrangement can be further increased if the outputs of a plurality of cell DC/DC converters can be connected in series by means of switches and/or the outputs of the series-connected cell DC/DC converters are brought out via a switch as outputs of the test arrangement.

The present invention is explained in more detail below with reference to the attached drawings, which show advantageous embodiments of the invention in an exemplary, schematic and non-restricting form. In the drawings.

DETAILED DESCRIPTION

Figure 1:
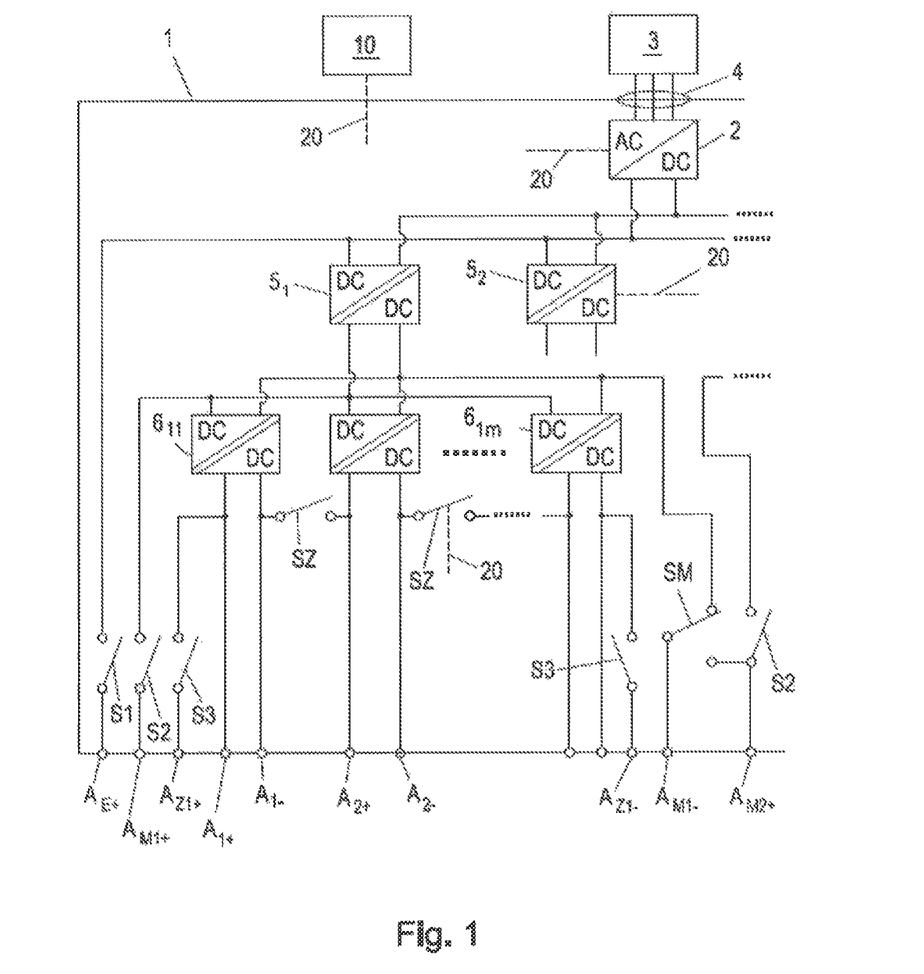
FIG. 1 shows a test arrangement according to an embodiment of the invention.

The test arrangement 1 according to the invention for electrical energy storage devices consists of a bidirectional AC/DC converter 2 on the input side which can be connected by means of an input connector 4 to a power supply 3, e.g. a 400 VAC voltage source. A number of (at least one) module DC/DC converters $5_1 \ldots 5_n$ are connected in parallel to the DC output of the AC/DC converter 2, e.g. a 400 VDC output. The module DC/DC converters $5_1 \ldots 5_n$ are designed as commercially available bidirectional isolated DC/DC converters. The module DC/DC converters $5_1 \ldots 5_n$ convert the high-voltage DC output of the AC/DC converter 2 to a DC voltage which corresponds to the voltage range of an energy storage module, such as a battery module or a fuel cell module for example, consisting of a plurality of energy storage units, such as battery cells or fuel cells for example, e.g. 12V or 48V DC. The outputs of the module DC/DC converters $5_1 \ldots 5_n$ can also be connected in series by means of switches SM, which is possible as the module DC/DC converters $5_1 \ldots 5_n$ are designed as isolated DC/DC converters.

A number of (at least one) cell DC/DC converters $6_{11} \ldots 6_{nm}$ are connected in parallel to the output of a module DC/DC converter $5_1 \ldots 5_n$. The cell DC/DC converters $6_{11} \ldots 6_{nm}$ are designed as commercially available isolated DC/DC converters. At the same time however, the cell DC/DC converters $6_{11} \ldots 6_{nm}$ can also be designed as bidirectional DC/DC converters. The cell DC/DC converters $6_{11} \ldots 6_{nm}$ convert the DC output of the associated module DC/DC converter $5_1 \ldots 5_n$ to a DC voltage which corresponds to the voltage range of the energy storage unit of an energy storage module, e.g. 0.5V to 5.5V DC for battery cells of a battery module. The outputs of the cell DC/DC converters $6_{11} \ldots 6_{nm}$ can also be connected in series by means of switches SZ, which is possible as the cell DC/DC converters $6_{11} \ldots 6_{nm}$ are designed as isolated DC/DC converters.

At energy storage device level, the outputs $A_{E+}$, $A_{E-}$ of the AC/DC converter 2, and, at energy storage module level, the outputs $A_{M1+}$, $A_{M1-} \ldots A_{Mn+}$, $A_{Mn-}$ of the module DC/DC converters $5_1 \ldots 5_n$ and the outputs $A_{1+}$, $A_{1-} \ldots A_{x+}$, $A_{x-}$ of the cell DC/DC converters $6_{11} \ldots 6_{nm}$ can be brought out as outputs of the test arrangement 1 and can be connected electrically. Likewise, preferably each of the first and last output $A_{Z1+}$, $A_{Z1-} \ldots A_{Zx+}$, $A_{Zx-}$ of the series-connectable cell DC/DC converters $6_{11} \ldots 6_{nm}$ are brought out as shown in FIG. 1.

The outputs $A_{E+}$, $A_{E-}$ of the AC/DC converter 2 can be activated by means of switch S1. The outputs $A_{M1+}$, $A_{M1-} \ldots A_{Mn+}$, $A_{Mn-}$ of the module DC/DC converters $5_1 \ldots 5_n$ can be activated by means of switch S2. The outputs $A_{Z1+}$, $A_{Z1-} \ldots A_{Zx+}$, $A_{Zx-}$ of the series-connectable cell DC/DC converters $6_{1m} \ldots 6_{nm}$, that is to say in essence the first and last output of the series-connected cell DC/DC converters $6_{11} \ldots 6_{nm}$, can be activated by means of switch S3.

In the maximum configuration, a test arrangement 1 according to the invention has, for example, an AC/DC converter 2 to which eight module DC/DC converters $5_1 \ldots 5_8$ are connected, to each of which 12 cell DC/DC converters $6_{11} \ldots 6_{812}$ are connected. As a result, consequently, up to 96 energy storage units or 8 energy storage modules each comprising 12 energy storage units can be tested or formed. Other expansion stages are of course conceivable.

In this case, the AC/DC converter 2, the module DC/DC converters $5_1 \ldots 5_n$ and the cell DC/DC converters $6_{11} \ldots 6_{nm}$ are controlled according to requirements by a control unit 10, which can also be integrated into the test arrangement 1. Likewise, the control unit 10 can control the opening/closing of the switches S1, S2, S3, SM, SZ. The control cables 20 from the control unit 10 to the individual components of the test arrangement 1 are not shown or are only indicated in FIG. 1 for reasons of clarity.

The function of the test arrangement 1 according to the invention is described in more detail below based on a specific exemplary embodiment in the form of a test and forming system for an electrical energy storage device.

Figure 2:
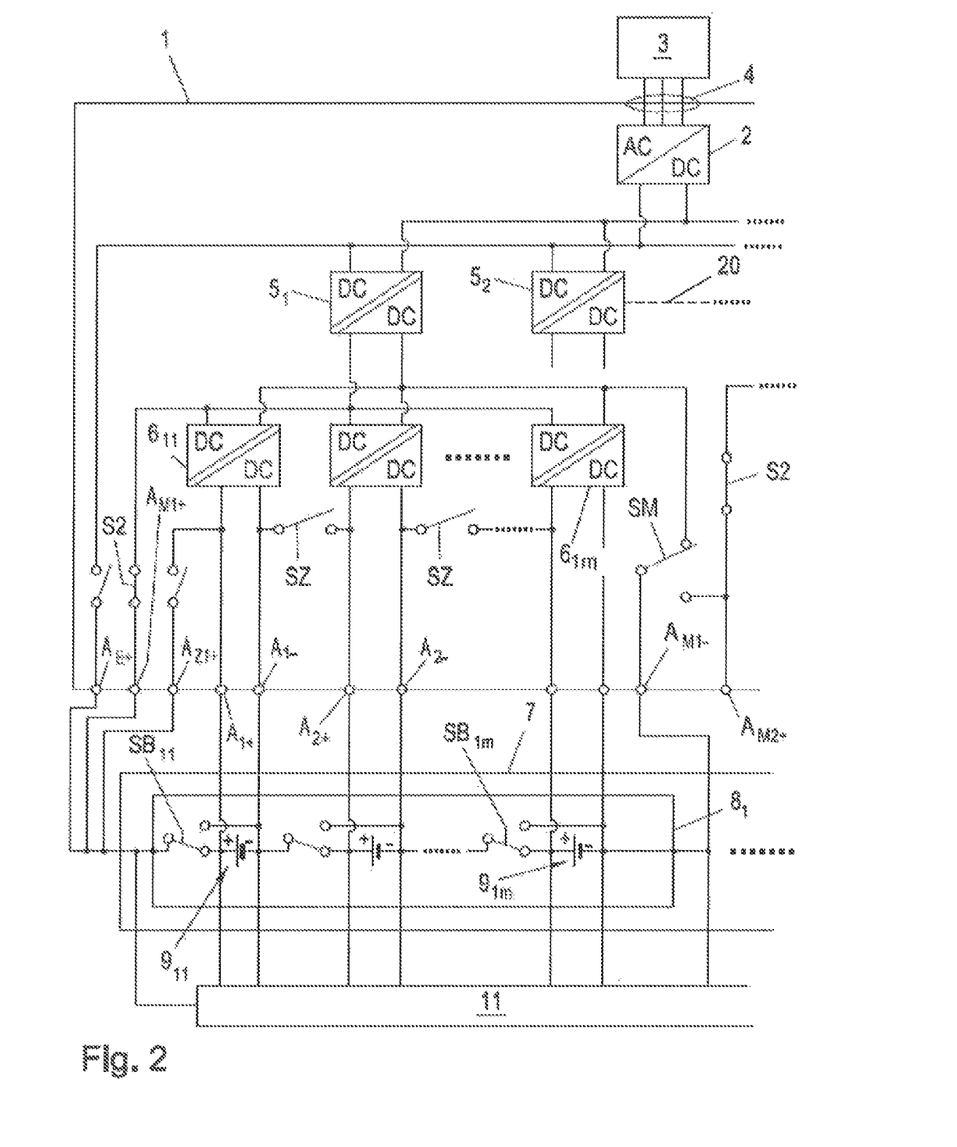
FIGS. 2 and 3 show the use of the test arrangement for testing or forming battery cells.

In the example according to FIG. 2, the test arrangement 1 according to the invention is connected to a battery pack 7 consisting of n battery modules $8_1 \ldots 8_n$ each comprising m battery cells $9_{11} \ldots 9_{nm}$ in order to test or form the battery pack 7. Each battery cell $9_{11} \ldots 9_{nm}$ is connected to the output $A_{1+}$, $A_{1-} \ldots A_{x+}$, $A_{x-}$ of a cell DC/DC converter $6_{11} \ldots 6_{nm}$ of the test arrangement 1. Here, the battery modules $8_1 \ldots 8_n$ are not connected in series but each module DC/DC converter $5_1 \ldots 5_n$ is in each case connected to a battery module $8_1 \ldots 8_n$. For this purpose, the switches S2 are closed and the connection between the module DC/DC converters $5_1 \ldots 5_n$ is opened by the switch SM. By this means, each battery cell $9_{11} \ldots 9_{nm}$ can be provided with any (within the voltage and current capacity of the cell DC/DC converters $6_{11} \ldots 6_{nm}$) load current (charge/discharge current) and individual battery cells $9_{11} \ldots 9_{nm}$ can be differently charged or discharged. This enables a battery pack 7, individual battery modules 8 or even individual battery cells 9 to be tested. Other energy storage modules or energy storage cells can also be tested instead of a battery pack or battery modules. Each battery cell 9 or each battery module 8 can also be connected to a battery management system 11 (BMS) which is sufficiently well known. The battery management system 11 can also be connected to the control unit 10 to enable actual values of the cells or modules to be measured and processed.

When using unidirectional cell DC/DC converters $6_{11} \ldots 6_{nm}$, discharging can only take place at energy storage module level, as is described with reference to the module DC/DC converter $5_n$ in FIG. 2. In order to discharge the battery cells $9_{n1} \ldots 9_{nm}$ which are connected to the cell DC/DC converters $6_{n1} \ldots 6_{nm}$ of the module DC/DC converter $5_n$, the switches SZ and the switches S2, S3 are closed, whereby the outputs of the cell DC/DC converters $6_{n1} \ldots 6_{nm}$ are connected in series and are connected via the outputs $A_{Zx+}$, $A_{Zx-}$ to the outputs $A_{Mn+}$, $A_{Mn-}$ of the module DC/DC converter $5_n$. The module DC/DC converter $5_n$ now applies a discharge current to the battery cells $9_{n1} \ldots 9_{nm}$, and the cell DC/DC converters $6_{n1} \ldots 6_{nm}$ are deactivated. By this means, the battery cells $9_{n1} \ldots 9_{nm}$ are all discharged with the same discharge current. If an individual battery cell $9_{n1} \ldots 9_{nm}$ (or a plurality thereof) is not to be discharged, the discharge current of the module DC/DC converter $5_n$ can be compensated for by the associated cell DC/DC converter $6_{n1} \ldots 6_{nm}$ in that the latter generates an equal and opposite charging current which acts on the battery cells $9_{n1} \ldots 9_{nm}$.

As a result of the interaction of cell DC/DC converters $6_{11} \ldots 6_{nm}$ and the associated module DC/DC converter $5_n$, each individual battery cell $9_{n1} \ldots 9_{nm}$ can be tested or formed with any load current in the manner described above. In particular, the current of a module DC/DC converter $5_1 \ldots 5_n$ can be overlaid by any current of a cell DC/DC converter $6_{11} \ldots 6_{nm}$, whereby the current of the module DC/DC converter $5_1 \ldots 5_n$ at energy storage unit level can also be strengthened.

When switches S1, S2, S3, SZ and SM are open, only voltages which lie below the safety extra-low voltage level are present at the outputs $A_{1+}$, $A_{1-} \ldots A_{x+}$, $A_{x-}$ and $A_{Z1+}$, $A_{Z1-} \ldots A_{Zx+}$, $A_{Zx-}$ of the cell DC/DC converters $6_{11} \ldots 6_{nm}$ and at the outputs $A_{M1+}$, $A_{M1-} \ldots A_{Mn+}$, $A_{Mn-}$ of the module DC/DC converters $5_1 \ldots 5_n$, as a result of which protection against contact can be entirely dispensed with. This is particularly interesting for forming and energy storage.

At the same time, the battery cells $9_{11} \ldots 9_{nm}$ can also be connected or disconnected individually by means of switches $SB_{11} \ldots SB_{nm}$ between the series-connected battery cells $9_{11} \ldots 9_{nm}$. In doing so, the switches $SB_{11} \ldots SB_{nm}$ can also be controlled by the control unit 10.

When a cell DC/DC converter is designed as a bidirectional DC/DC converter $6_{11} \ldots 6_{nm}$, this also enables discharging to be carried out at energy storage unit level (battery cell).

Figure 3:
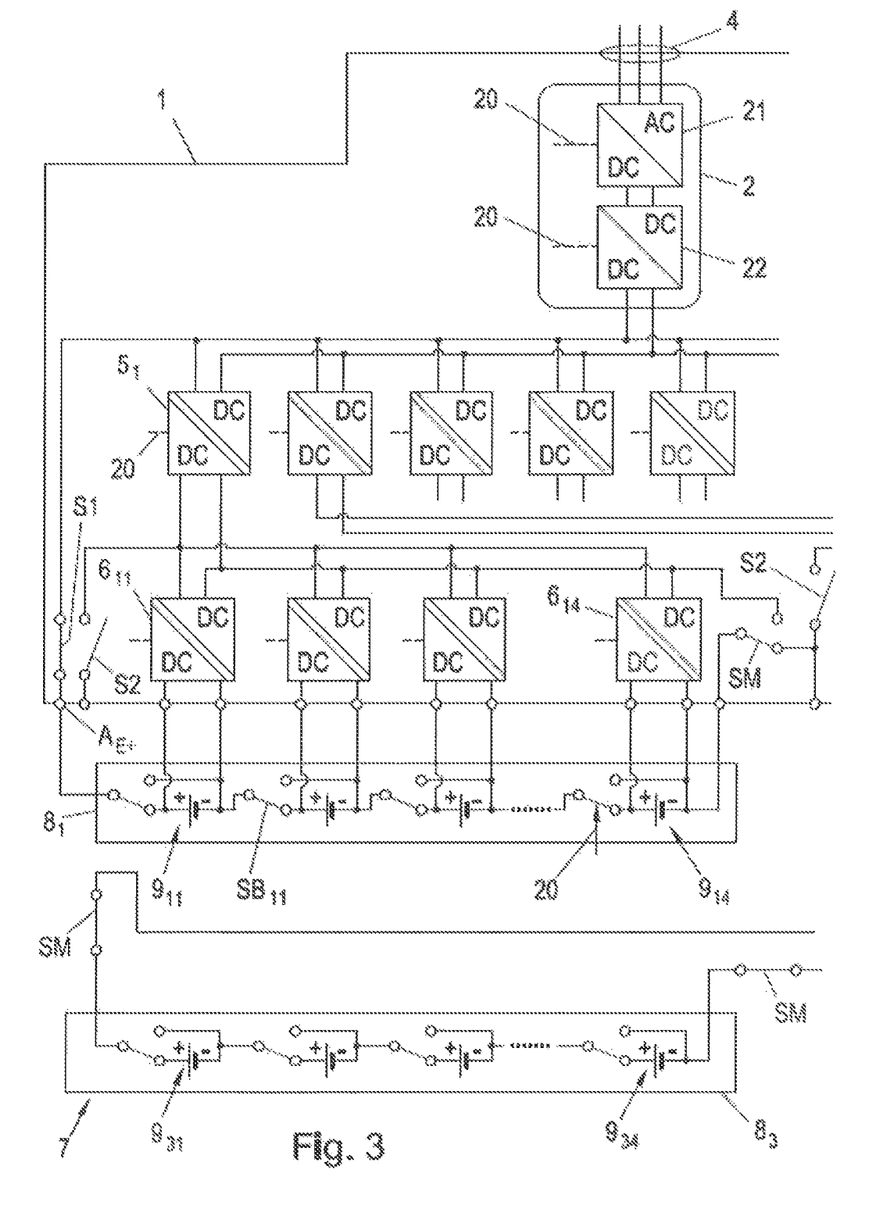

FIG. 3 shows the use of the test arrangement 1 in a test system with a battery pack 7 (energy storage device) consisting of four battery modules $8_1 \ldots 8_4$ (energy storage modules) each comprising four battery cells $9_{11} \ldots 9_{44}$ (energy storage units) which are in each case connected in series by means of the switches $SB_{11} \ldots SB_{44}$. The individual battery modules $8_1 \ldots 8_4$ are connected in series by means of switches SM. For this purpose, the switches S1 at energy storage device level are closed and the switches S2 at energy storage module level are open. Here, the AC/DC converter 2 is designed in two stages having an AC/DC converter 21 on the input side and a DC/DC converter 22 connected thereto.

The invention claimed is:

1. A test arrangement for an energy storage device having at least one energy storage module with a plurality of energy storage units, having an AC/DC converter which is connected on an input side to a power supply, wherein the AC/DC converter is connected on an output side to a plurality of parallel-connected bidirectional isolated module DC/DC converters ($5_1 \ldots 5_n$), wherein an output of each bidirectional isolated module DC/DC converter ($5_1 \ldots 5_n$) is connected to a plurality of parallel-connected cell DC/DC converters ($6_{11} \ldots 6_{nm}$), wherein outputs of the cell DC/DC converters ($6_{11} \ldots 6_{nm}$) are brought out as outputs ($A_{1+}$, $A_{1-} \ldots A_{x+}$, $A_{x-}$) of the test arrangement, and including switches for connecting the outputs of the module DC/DC converters in series.

2. The test arrangement as claimed in claim 1, wherein the outputs of the module DC/DC converters ($5_1 \ldots 5_n$) are brought out via a switch (S2) as outputs ($A_{M+}$, $A_{M1-} \ldots A_{Mn+}$, $A_{Mn-}$) of the test arrangement.

3. A test arrangement for an energy storage device having at least one energy storage module with a plurality of energy storage units, having an AC/DC converter which is connected on an input side to a power supply, wherein the AC/DC converter is connected on an output side to a plurality of parallel-connected bidirectional isolated module DC/DC converters ($5_1 \ldots 5_n$), wherein an output of each bidirectional isolated module DC/DC converter ($5_1 \ldots 5_n$) is connected to a plurality of parallel-connected cell DC/DC converters ($6_{11} \ldots 6_{nm}$), wherein outputs of cell DC/DC converters ($6_{11} \ldots 6_{nm}$) are brought out as outputs ($A_{1+}$, $A_{1-} \ldots A_{x+}$, $A_{x-}$) of the test arrangement, and including switches for connecting the outputs of a plurality the cell DC/DC converters in series.

4. The test arrangement as claimed in claim 3, wherein the outputs of the series-connected cell DC/DC converters ($6_{11} \ldots 6_{nm}$) are brought out via a switch (S3) as outputs ($A_{Z1+}$, $A_{Z1-} \ldots A_{Zx+}$, $A_{Zx-}$) of the test arrangement.

5. The test arrangement as claimed in claim 1, wherein the outputs of the AC/DC converter are brought out via a switch (S1) as outputs ($A_{E+}$, $A_{E-}$) of the test arrangement.

6. A method of using the test arrangement as claimed in claim 1 for testing or forming an energy storage device consisting of at least one energy storage module having at least one energy storage unit, wherein the at least one energy storage unit of the energy storage module is connected to an output ($A_{1+}$, $A_{1-} \ldots A_{x+}$, $A_{x-}$) of a cell DC/DC converter ($6_{11} \ldots 6_{nm}$).

7. The method as claimed in claim 6, wherein at least two energy storage units of the energy storage device are connected in series and each energy storage unit is connected to an output ($A_{1+}$, $A_{1-} \ldots A_{x+}$, $A_{x-}$) of a cell DC/DC converter ($6_{11} \ldots 6_{nm}$).

8. The method as claimed in claim 7, wherein the two energy storage units are connected to one another by means of a switch ($SB_{11} \ldots SB_{nm}$).

9. The method as claimed in claim 6, wherein at least two energy storage modules are connected in series.

10. The method as claimed in claim 6, wherein the outputs ($A_{M1+}$, $A_{M1-} \ldots A_{Mn+}$, $A_{Mn-}$) of a module DC/DC converter ($5_1 \ldots 5_n$) are connected to the series-connected outputs ($A_{Z1+}$, $A_{Z1-} \ldots A_{Zx+}$, $A_{Zx-}$) of the associated series-connected cell DC/DC converters ($6_{11} \ldots 6_{nm}$).

11. The method as claimed in claim 10, wherein the cell DC/DC converters ($6_{11} \ldots 6_{nm}$) are deactivated.

12. The method as claimed in claim 10, wherein at least one cell DC/DC converter ($6_{11} \ldots 6_{nm}$) generates a load current.

13. The test arrangement as claimed in claim 1, wherein the cell DC/DC converters are isolated DC/DC converters.

14. The test arrangement as claimed in claim 3, wherein the cell DC/DC converters are isolated DC/DC converters.

15. The method as claimed in claim 6, wherein the cell DC/DC converter is an isolated DC/DC converter.

* * * * *